United States Patent
Weber et al.

(10) Patent No.: US 10,381,344 B2
(45) Date of Patent: *Aug. 13, 2019

(54) METHOD OF FORMING MOS AND BIPOLAR TRANSISTORS

(71) Applicants: STMicroelectronics (Crolles 2) SAS, Crolles (FR); STMicroelectronics (Rousset) SAS, Rousset (FR); Commissariat A L'Energie Atomique et aux Energies Alternatives, Paris (FR)

(72) Inventors: Olivier Weber, Grenoble (FR); Emmanuel Richard, Saint Pierre D'allevard (FR); Philippe Boivin, Venelles (FR)

(73) Assignees: STMicroelectronics (Crolles 2) SAS, Crolles (FR); STMicroelectronics (Rousset) SAS, Rousset (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/897,524

(22) Filed: Feb. 15, 2018

(65) Prior Publication Data

US 2018/0175022 A1    Jun. 21, 2018

Related U.S. Application Data

(63) Continuation of application No. 15/454,788, filed on Mar. 9, 2017, now Pat. No. 9,929,146.

(30) Foreign Application Priority Data

Mar. 21, 2016 (FR) ...................... 16 52379

(51) Int. Cl.
*H01L 27/06* (2006.01)
*H01L 21/84* (2006.01)
(Continued)

(52) U.S. Cl.
CPC ...... *H01L 27/0623* (2013.01); *H01L 21/8249* (2013.01); *H01L 21/84* (2013.01);
(Continued)

(58) Field of Classification Search
None
See application file for complete search history.

(56) References Cited

U.S. PATENT DOCUMENTS 6,365,447 B1  4/2002  Hebert et al.
6,790,722 B1  9/2004  Divakaruni et al.
(Continued)

OTHER PUBLICATIONS

INPI Search Report and Written Opinion for FR 1652379 dated Dec. 19, 2016 (6 pages).

*Primary Examiner* — Asok K Sarkar
(74) *Attorney, Agent, or Firm* — Crowe & Dunlevy

(57) ABSTRACT

Bipolar transistors and MOS transistors are formed in a common process. A semiconductor layer is arranged on an insulating layer. On a side of the bipolar transistors: an insulating region including the insulating layer is formed; openings are etched through the insulating region to delimit insulating walls; the openings are filled with first epitaxial portions; and the first epitaxial portions and a first region extending under the first epitaxial portions and under the insulating walls are doped. On the side of the bipolar transistors and on a side of the MOS transistors: gate structures are formed; second epitaxial portions are made; and the second epitaxial portions covering the first epitaxial portions are doped.

13 Claims, 4 Drawing Sheets

(51) Int. Cl.
  *H01L 27/24*    (2006.01)
  *H01L 21/8249*  (2006.01)
  *H01L 29/732*   (2006.01)
  *H01L 45/00*    (2006.01)
  *H01L 29/417*   (2006.01)
  *H01L 29/66*    (2006.01)
  *H01L 27/12*    (2006.01)
  *H01L 29/08*    (2006.01)

(52) U.S. Cl.
  CPC ...... *H01L 27/1207* (2013.01); *H01L 27/2445* (2013.01); *H01L 29/0813* (2013.01); *H01L 29/41708* (2013.01); *H01L 29/66303* (2013.01); *H01L 29/732* (2013.01); *H01L 45/06* (2013.01); *H01L 45/1206* (2013.01); *H01L 45/16* (2013.01); *H01L 45/126* (2013.01); *H01L 45/1233* (2013.01)

(56) References Cited

U.S. PATENT DOCUMENTS

| | | |
|---|---|---|
| 9,929,146 B2 * | 3/2018 | Weber ................. H01L 21/8249 |
| 2003/0168698 A1 | 9/2003 | Shin et al. |
| 2007/0045767 A1 | 3/2007 | Zhu et al. |
| 2007/0126064 A1 | 6/2007 | Pellizzer et al. |
| 2008/0017895 A1 | 1/2008 | Fallica et al. |
| 2008/0308837 A1 | 12/2008 | Gauthier, Jr. et al. |
| 2012/0264270 A1 | 10/2012 | Lin et al. |

* cited by examiner

METHOD OF FORMING MOS AND BIPOLAR TRANSISTORS

CROSS REFERENCE TO RELATED APPLICATIONS

This application is a continuation of U.S. application for patent Ser. No. 15/454,788 filed Mar. 9, 2017, which claims the priority benefit of French patent application number 1652379, filed on Mar. 21, 2016, the disclosures of which are hereby incorporated by reference.

TECHNICAL FIELD

The present disclosure relates to electronic chip manufacturing methods, and more particularly to a method of forming vertical bipolar transistors in CMOS technology.

BACKGROUND

Electronic chips may contain both logic circuits and phase-change memory circuits. Logic circuits comprise many MOS-type transistors. Memory circuits include memory cells arranged in an array, and each memory cell is associated with a vertical bipolar transistor. Such a transistor is used to independently program, erase or read each memory cell. The bipolar transistors corresponding to the memory cells of a same row of the array have a common base. The memory cells of a same column of the array are arranged between the emitter of the corresponding bipolar transistor and a common upper metallization. When it is desired to program, erase, or read a memory cell, the bipolar transistors of the corresponding rows are turned on and a voltage is applied to the upper metallization of the corresponding column. A memory cell programming, erasing, or reading current is thus circulated in the memory cell.

Conventional methods have been provided to form in a portion of a chip, complementary MOS transistors and, in another portion of the chip, vertical bipolar transistors controllable by a common base. Such methods raise various implementation issues.

There is a need for a method which is simple and compatible with a conventional CMOS technology, enabling to form at the same time complementary MOS transistors and bipolar transistors having a common base.

SUMMARY

Thus, an embodiment provides a method of forming vertical bipolar transistors and MOS transistors, comprising the steps of: a) providing a semiconductor layer arranged on an insulating layer covering a semiconductor substrate of a first conductivity type; on the side of the bipolar transistors: b) forming an insulating region comprising said insulating layer and extending all the way to the upper surface of the assembly; c) etching openings reaching the substrate through said insulating region, thus delimiting insulating walls; d) forming by selective epitaxy a semiconductor to fill the openings with first epitaxial portions; and e) performing a doping of a second conductivity type of the first epitaxial portions and of a first region extending at the upper portion of the substrate under the first epitaxial portions and under the insulating walls; on the side of the bipolar transistors and on the side of the MOS transistors: f) forming gate structures; g) forming by selective epitaxy second epitaxial semiconductor portions; and h) performing a doping of the first conductivity type of the second epitaxial portions covering the first epitaxial portions.

According to an embodiment, at step c), the openings are etched with a gate pitch of the MOS transistors and at step f), the gate structures are formed with said gate pitch.

According to an embodiment, step b) comprises a step of oxidizing the semiconductor layer across its entire thickness.

According to an embodiment, step b) comprises a step of removing the semiconductor layer across its entire thickness.

According to an embodiment, the method further comprises before step f) a step of forming insulating trenches delimiting the first region.

According to an embodiment, step f) comprises a step of forming insulating lateral spacers comprised in the gate structures.

According to an embodiment, the method further comprises a step of forming vias arranged on the second epitaxial portions, followed by a step of forming phase-transition memory cells arranged on the vias.

According to an embodiment, the semiconductor layer is made of silicon.

According to an embodiment, the semiconductor layer has a thickness smaller than 20 nm.

According to an embodiment, the insulating walls have a thickness in the range from 25 to 30 nm.

According to an embodiment, the insulating walls extend as deep as the insulating layer.

According to an embodiment, the gate pitch is in the range from 80 to 150 nm.

Another embodiment provides a device comprising: vertical bipolar transistors having a common collector region covered with a common base region, and upper emitter regions separated by first gate structures provided with lateral spacers, the gate structures resting on insulating walls extending vertically in an upper portion of the base region; and MOS transistors each comprising drain and source regions having upper epitaxial portions separated by a second gate structure identical to the first gate structures, the first and second gate structures being regularly arranged, the upper emitter regions and the drain and source regions having upper surface arranged at identical levels to within 10 nm.

According to an embodiment, the first and second gate structures are arranged according to a same gate pitch.

According to an embodiment, the MOS transistors are arranged on an insulating layer, the insulating walls extending into the substrate as deep as the insulating layer.

BRIEF DESCRIPTION OF THE DRAWINGS

The foregoing and other features and advantages will be discussed in detail in the following non-limiting description of specific embodiments in connection with the accompanying drawings, wherein.

The same elements have been designated with the same reference numerals in the various drawings and, further, the various drawings are not to scale. For clarity, only those steps and elements which are useful to the understanding of the described embodiments have been shown and are detailed.

DETAILED DESCRIPTION

Figure 1:
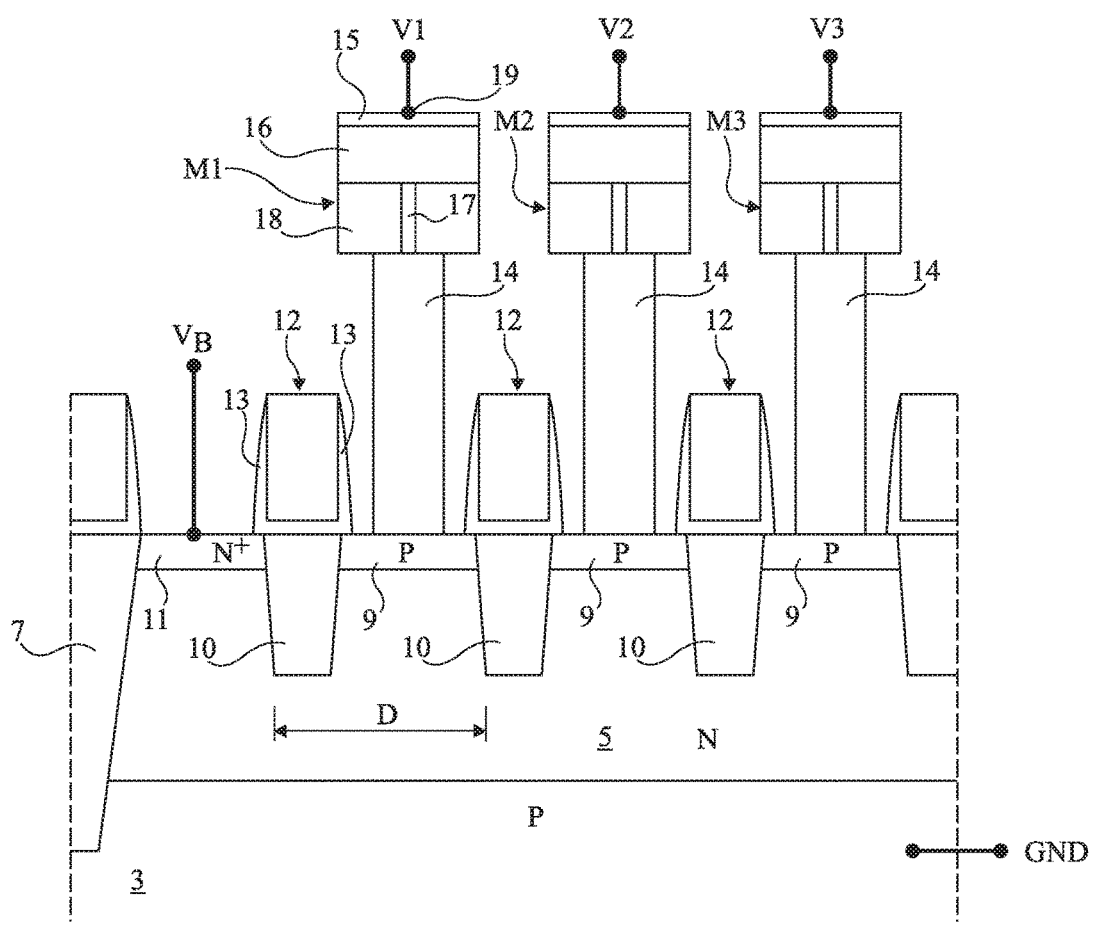
FIG. 1 is a partial simplified cross-section view of a portion of an electronic chip comprising bipolar transistors.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying absolute positions, such as terms "left-hand", "right-hand" or relative positions, such as terms "on", "under", "above", "below", "upper", "lower", etc., or to terms qualifying orientation, such as term "vertical", reference is made to the orientation of the concerned element in the concerned drawings. Unless otherwise specified, term "insulating" qualifies electrically-insulating elements.

FIG. 1 is a partial simplified cross-section view of a portion of an electronic chip comprising bipolar transistors and resistive memory cells, for example, phase-change cells. The chip comprises a P-type doped silicon substrate 3. An N-type doped region 5 is located in the upper portion of substrate 3 and is delimited, on the left-hand side of the drawing, with an insulating trench 7. P-type doped regions 9 extend in the upper portion of region 5 and are regularly positioned with a pitch D. P regions 9 are separated by surface insulation trenches 10. Insulation trenches 10 extend vertically in N region 5 all the way to a level located below the lower level of P regions 9. N region 5 is provided with an N+ contact area 11 connected to a node of application of a voltage $V_B$.

Gate structures 12 of MOS transistors are regularly arranged on the upper surface of insulating trenches 7 and 10 with the same pitch D as surface trenches 10. Each gate structure 12 comprises lateral spacers 13. Each P region 9 is connected by a via 14 to a phase-change memory cell located above via 14. Each memory cell comprises under an upper metallization 15, a phase-change material 16 and a resistive element 17 surrounded with an insulator 18 and located between material 16 and via 14. Three memory cells M1, M2, and M3 are shown in FIG. 1 and correspond to memory cells of a row of memory cells arranged in an array. Upper metallizations 15 of memory cells M1, M2, and M3 are coupled to nodes of application of respective potential voltages V1, V2, V3 by contacts 19.

The lower portion of P-type doped substrate 3, N-type doped region 5, and P-type doped regions 9 form vertical PNP bipolar transistors. Each P region 9 forms an upper emitter region of a bipolar transistor. N region 5 is a common base region, and the lower portion of the substrate is a common collector. This common collector is connected to a ground voltage GND.

To program or erase memory cell M1, a low potential level VB is applied to the common base region. The application of a selected high level of potential V1 enables to circulate a programming or erasing current in the resistive element of memory cell M1. This results in a heating and a change of the phase of the phase-change material of memory cell M1. The use of vertical bipolar transistors enables to circulate high programming or erasing currents, for example, greater than 100 µA, on a small surface area, enabling to integrate high-density memories. The presence of surface insulation trenches enables to limit the flowing of leakage currents from emitter region 9 associated with memory cell M1 to the neighboring memory cells. Such leakage currents are particularly due to the presence of parasitic bipolar transistors formed by the P regions 9 of the neighboring transistors separated by base region 5.

It is desired to simultaneously form, in a way compatible with CMOS technology, lateral MOS transistor and vertical bipolar transistors. The MOS transistors may be logic circuit transistors and the bipolar transistors may be non-volatile memory cell transistors which are desired to be correctly insulated from one another. Bipolar transistors having a common base and which are separated from one another by insulating structures such as surface trenches are desired to be obtained.

FIGS. 2 to 11 are partial simplified cross-section views illustrating steps of an embodiment of a method of simultaneously manufacturing vertical bipolar transistors and MOS transistors. Each drawing illustrates, on the right-hand side, the forming of the vertical bipolar transistors and, on the left-hand side, the forming of the MOS transistors.

Figure 2:
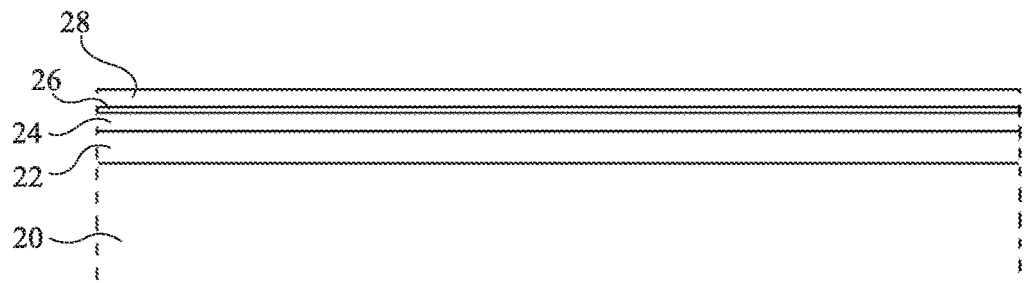
FIGS. 2 to 11 are partial simplified cross-section views illustrating steps of an embodiment of a method of manufacturing vertical bipolar transistors and MOS transistors.

At the step illustrated in FIG. 2, a structure of semiconductor on insulator, SOI, type, comprising, on a semiconductor substrate 20, for example, made of P-type doped silicon, an insulating layer 22 having a semiconductor layer 24, for example, made of silicon, extending thereon, has been provided. The SOI structure is covered with an etch stop layer 26, for example, made of silicon oxide. A silicon nitride layer 28 is then deposited. As an example, semiconductor layer 24 has a thickness smaller than 20 nm. The etch stop layer may have a thickness smaller than 5 nm.

Figure 3:
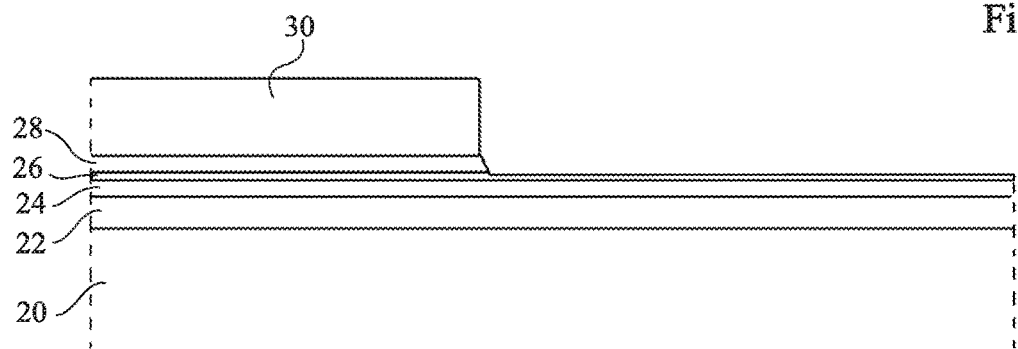

At the step illustrated in FIG. 3, a resin mask has been formed on the left-hand side on the upper surface of layer 28. The right-hand portion of the silicon nitride layer is then removed by an etching stopping at the level of etch stop layer 26.

Figure 4:
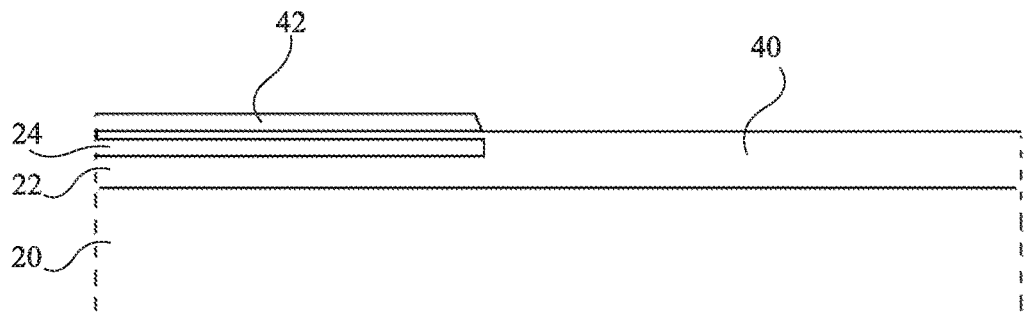

At the step illustrated in FIG. 4, mask 30 has been removed. A thermal oxidation of the upper surface of the structure is then carried out to oxidize the right-hand portion of semiconductor layer 24 across its entire thickness. The right-hand portions of insulating layers 22 and 26 and the oxidized portion of layer 24 form an insulating region 40 on the right-hand side. Region 40 extends from the lower level of layer 22 to the upper surface of the structure. The left-hand portion of layer 28 forms a hard mask 42 which enables to keep intact the left-hand portion of semiconductor layer 24.

As a variation of the step illustrated in FIG. 4, after having removed mask 30, one may remove by etching layer 26 and then semiconductor 24 across its entire thickness. An insulating region 40 which then corresponds to the right-hand portion of layer 22 is obtained.

Figure 5:
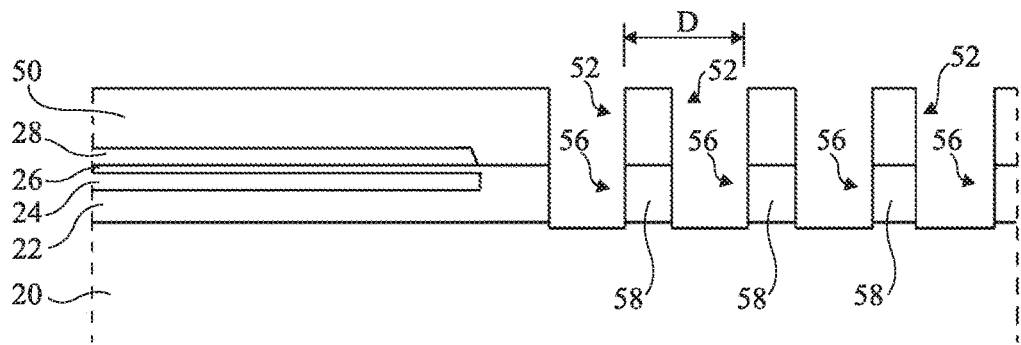

At the step illustrated in FIG. 5, a resin mask 50 comprising in its right-hand portion openings 52 arranged with regular gate pitch D of the network of MOS transistor gates which will be subsequently formed. By an etch step, openings 52 are then vertically continued by openings 56 through insulating portion 40 all the way into the upper portion of substrate 20. The formed openings 56 thus delimit insulating walls 58 regularly arranged according to gate pitch D. As an example, gate pitch D is in the range form 80 nm to 150 nm. As an example, the distance separating two neighboring openings 56, or width of the insulating walls, is in the range from 20 to 40 nm. As an example, the thickness or height of the insulating walls is in the range from 25 nm to 30 nm. Insulating layer 22 may have a 25-nm thickness.

Figure 6:
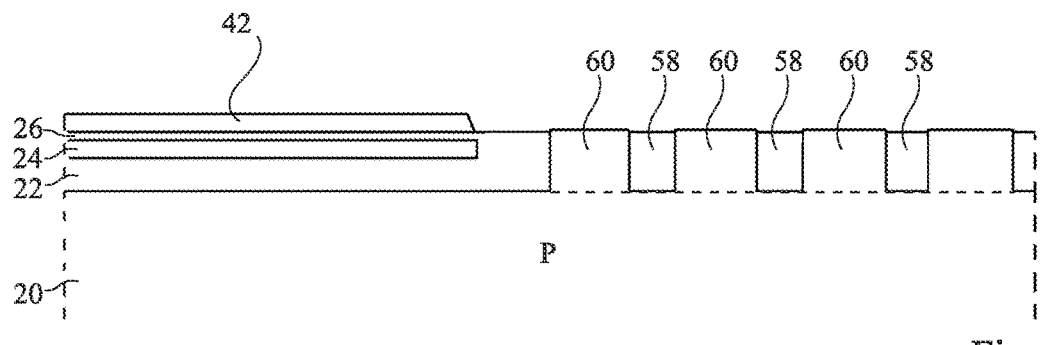

At the step illustrated in FIG. 6, mask 50 has first been removed. A selective silicon epitaxy is then performed. Epitaxial portions 60 form from the bottom of openings 56, and grow between insulating walls 58. The epitaxy is stopped when epitaxial portions 60 fill openings 56 up to the upper level of insulating walls 58.

Figure 7:
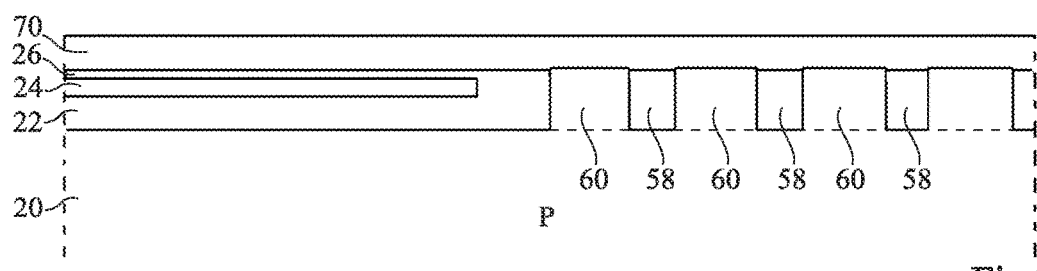

At the step illustrated in FIG. 7, hard mask 42 has been removed. A multilayer 70 comprising a silicon oxide layer and a silicon nitride layer is then deposited on the upper surface of the entire structure.

Figure 8:
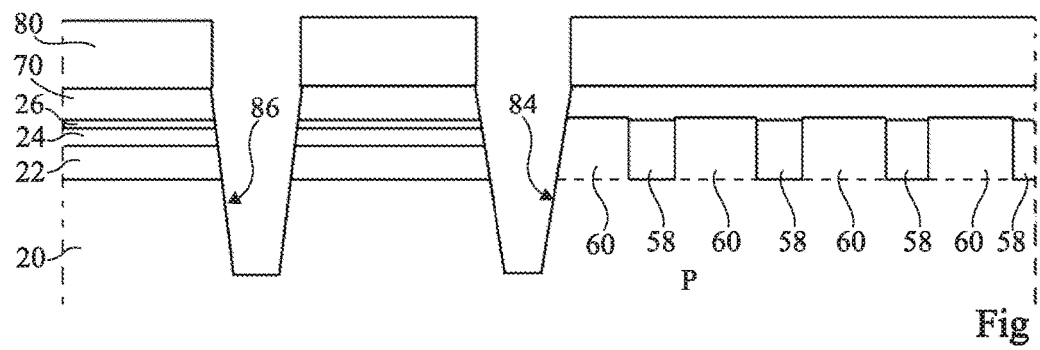

At the step illustrated in FIG. 8, a mask 80 has been formed on the upper surface of the entire structure. Trenches are formed down to a level located in substrate 20. A trench 84 separates the left-hand side corresponding to the MOS transistors from the right-hand side corresponding to the bipolar transistors. Trenches 84 may also separate on the right-hand side portions each corresponding to a group of bipolar transistors having a common base. Trenches 86 for separating the MOS transistors are located on the left-hand side.

Figure 9:
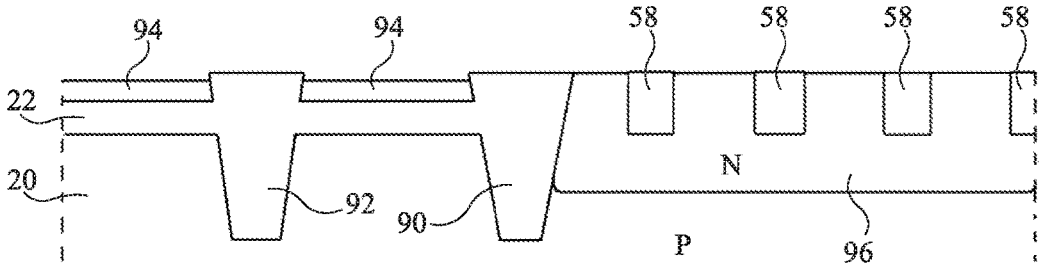

At the step illustrated in FIG. 9, trenches 84 and 86 have been filled with silicon oxide, forming respective insulating trenches 90 and 92. Mask 80, multilayer 70, and insulating trench portions 90 and 92 located above the lower level of multilayer 70 have been removed. On the left-hand side, the remaining portions of etch stop layer 26 have then been removed. The remaining portions of semiconductor layer 24 form slabs or active semiconductor areas 94 (or thin semiconductor films) resting on insulating layer 22 and separated by insulating trenches 92. One then performs, on the right-hand side, an N-type doping by ion implantation to form a doped region 96 which extends from the upper surface into epitaxial portions 60 and into substrate 20, all the way to a level located in the substrate above the lower level of insulating trenches. N-type doped region 96 extends under insulating walls 58.

Figure 10:
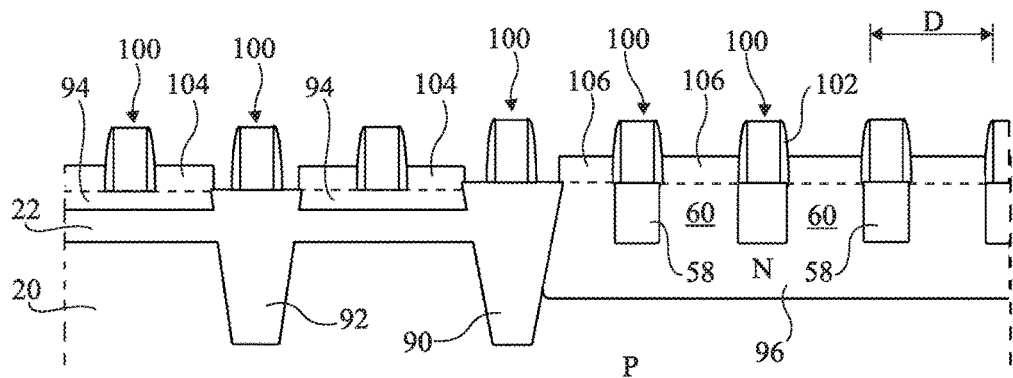

At the step illustrated in FIG. 10, a network of gates 100 regularly spaced apart according to gate pitch D has been simultaneously formed on the right-hand side and on the left-hand side. Each gate 100 is provided on its sides with lateral insulating spacers 102. Gate structures 100 have been positioned, on the right-hand side, on insulating walls 58 to form separation elements and, on the left-hand side, in the central position on slabs 94 to form the gates of MOS transistors.

A selective epitaxy of silicon is then performed on the surface of the entire structure, simultaneously on the right-hand side and on the left-hand side. On the left-hand side, epitaxial portions 104 form from the portions of semiconductor slabs 94 located on either side of gate structure 100. On the right-hand side, epitaxial portions 106 grow between insulating spacers 102 from the upper surface of portions 60 of N region 96. Epitaxial portions 106 and epitaxial portions 104 have upper surfaces located at identical levels to within 10 nm.

At the step illustrated in FIG. 11, an N-type doping has first been performed, on the left-hand side, in epitaxial portions 104 and portions of slabs 94 located below the epitaxial portions and, on the right-hand side, in one 114 of epitaxial portions 106. Drain and source areas 110 of N-channel MOS transistors have thus been obtained, the portions of slabs 94 located under the gates forming channel-forming areas 112 of the MOS transistors. A contact area 114 associated with N region 96 has thus been obtained. A P-type doping of epitaxial portions 106 is then carried out on the right-hand side. Upper portions of epitaxial portions 60 of regions 96 may also be doped. P-type doped regions 116 are thus obtained.

Vertical PNP-type bipolar transistors have been obtained on the right-hand side. Each P region 116 forms an upper emitter region of a bipolar transistor. N region 96 is a common base region, and the lower portion of P substrate 20 is a common collector. The upper emitter regions 116 of the bipolar transistors are separated, in particular, by gate structures 100. The gate structures electrically insulate the upper emitter regions 116 due to the presence of lateral insulating spacers 102. Each gate structure 100 forms with insulating wall 58 located thereunder an insulating structure 118 which separates neighboring emitter regions 116 and extends vertically in an upper portion of common base region 96. Insulating structures 118 thus enable to limit the circulation of leakage currents between neighboring bipolar transistors. Such leakage currents are due to the presence, in particular, of a parasitic bipolar transistor between a P area 116, an adjacent N area 60, and another P region 116, adjacent to N area 60. At a subsequent step, not shown, vias are formed on drain and source regions 110 of the MOS transistors and emitter regions 116 of the bipolar transistors. It should be noted that drain and source areas 110 and emitter regions 116 have upper surface located at substantially identical levels, which allows a particular easy forming of the vias. Resistive memory cells, for example, phase-change cells, may then be formed on the vias. Each memory cell is located on a via arranged on one of emitter regions 116 and covered with an upper metallization.

Figure 11:
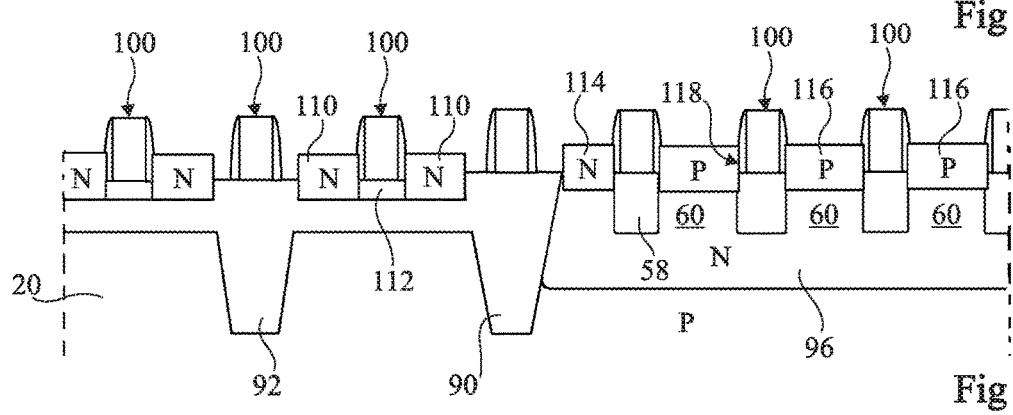

It should be noted that the steps of forming insulating trenches illustrated in FIGS. 7, 8, and 9, the epitaxy step illustrated in FIG. 10, and the doping steps illustrated in FIG. 11 are steps forming part of a method of manufacturing MOS transistors on a SOI structure. Further, such a MOS transistor manufacturing method may comprise a step of etching openings of the insulating layer of the SOI structure, for example, to form contacts with the substrate of the SOI structure. Such an etching may be performed at the same time as the etch step illustrated in FIG. 5. Thus, the described embodiments enable to manufacture insulated bipolar transistors by adding a small number of steps to a method of manufacturing MOS transistors on a SOI structure.

In the described embodiments, the manufacturing of a single group of vertical bipolar transistors having a common base is described. Other embodiments are possible, which enable to manufacture a plurality of groups of bipolar transistors.

Figure 12:
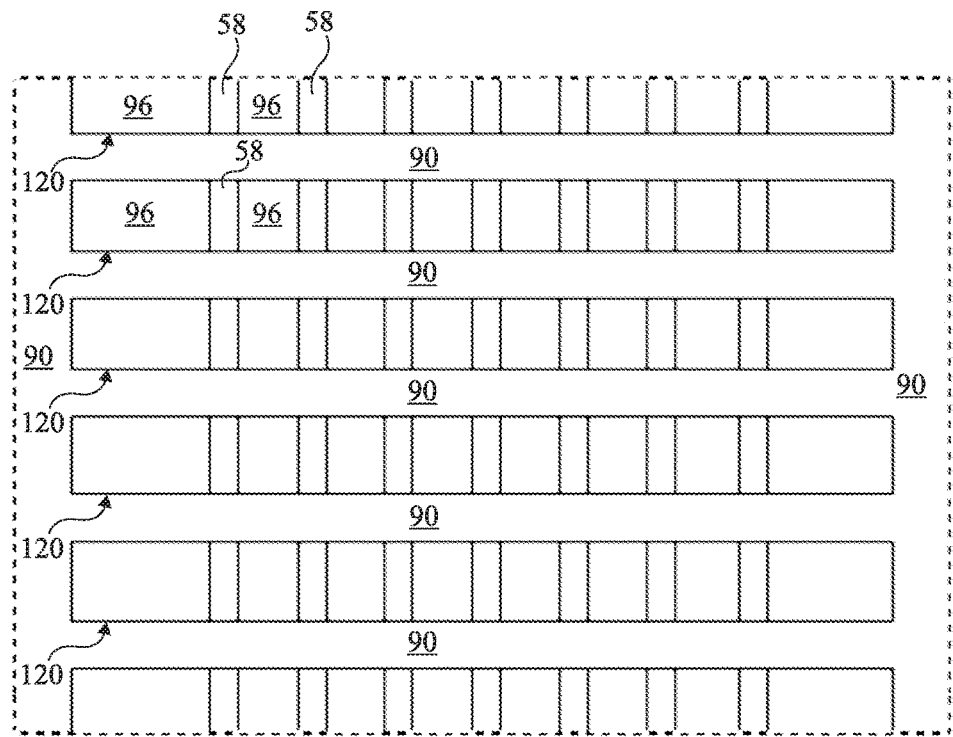
FIG. 12 is a simplified top view illustrating a step of an embodiment of a bipolar transistor manufacturing method.

FIG. 12 is a simplified top view illustrating an embodiment of a method of manufacturing such a plurality of groups 120 of transistors, the transistors of each group 120 having a common base and corresponding to a row of an array of resistive memory cells. FIG. 12 is a view at the step illustrated in FIG. 9, before the forming of gates 100. The common base regions 96 of neighboring groups 120 are separated by insulating trenches 90. The insulating walls 58 located in each common base region are shown.

Specific embodiments have been described. Various alterations, modifications, and improvements will occur to those skilled in the art. In particular, in the described embodiments, the left-hand side of the obtained structure only contains N-channel MOS transistors. In practice, P-channel MOS transistors will also be manufactured. Such transistors have drain and source areas which may be formed at the same time as emitter regions 116 of the bipolar transistors.

In the described embodiments, the bipolar transistors are of PNP type and formed from an SOI-type structure on a P-type substrate. Other embodiments may correspond to the described embodiments where the N and P conductivity types are inverted.

Further, although, in the described embodiments, a semiconductor silicon layer covers an insulator with a SOI structure, the semiconductor layer may be made of another semiconductor material.

Although embodiments where MOS transistors are formed have been described, it may be provided to form, next to the bipolar transistors, any other type of transistor on SOI structure, for example, dual-gate transistors, for example, of FinFET type.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of forming a vertical bipolar transistor and a MOS transistor supported by a substrate including a semiconductor layer arranged on an insulating layer covering a semiconductor substrate doped with a first conductivity type, comprising the steps of:

for the vertical bipolar transistor:
   a) etching an opening extending through the insulating region;
   b) epitaxially growing a first epitaxial portion from the semiconductor substrate which fills the opening; and
   c) doping the first epitaxial portion and a portion of the semiconductor substrate with a second conductivity type;

for the MOS transistor:
   d) forming a transistor gate extending over the semiconductor layer; and for both the vertical bipolar transistor and the MOS transistor:
   e) epitaxially growing second epitaxial portions from both the semiconductor layer and the first epitaxial portion;

wherein the second epitaxial portion over the first epitaxial portion forms an emitter of the bipolar transistor and wherein the second epitaxial portions on each side of the transistor gate form source and drain regions of the MOS transistor.

2. The method of claim 1, further comprising:
doping the second epitaxial portion over the first epitaxial portion with the first conductivity type; and
doping the second epitaxial portions on each side of the transistor gate with the second conductivity type.

3. The method of claim 1, further comprising, for the vertical bipolar transistor, removing the semiconductor layer.

4. The method of claim 1, further comprising forming a trench isolation between a region for the MOS transistor and a region for the vertical bipolar transistor.

5. The method of claim 4, wherein d) forming a transistor gate further comprises forming a further transistor gate extending on top of the trench isolation.

6. The method of claim 1, wherein the doped first epitaxial portion and portion of the semiconductor substrate form a base of the vertical bipolar transistor and wherein the semiconductor substrate forms a collector of the vertical bipolar transistor.

7. The method of claim 1, wherein the semiconductor layer is made of silicon.

8. The method of claim 1, wherein the semiconductor layer has a thickness smaller than 20 nm.

9. An integrated circuit, comprising:
a substrate including a semiconductor layer arranged on an insulating layer covering a semiconductor substrate doped with a first conductivity type;
a trench isolation separating a first region of the substrate from a second region of the substrate, wherein the second region does not include the semiconductor layer;
wherein the substrate in the second region includes an opening extending through the insulating layer;
first epitaxial material filling the opening to form a base of a bipolar transistor having a collector formed by at least a portion of said semiconductor substrate;
a transistor gate extending over the semiconductor layer;
second epitaxial material over the first epitaxial portion and over the semiconductor layer on each side of the transistor gate;
wherein the second epitaxial material over the first epitaxial portion forms an emitter of the bipolar transistor and wherein the second epitaxial material on each side of the transistor gate form source and drain regions of a MOS transistor.

10. The integrated circuit of claim 9, wherein the second epitaxial material over the first epitaxial portion is doped with the first conductivity type, and wherein the second epitaxial material on each side of the transistor gate is doped with the second conductivity type.

11. The integrated circuit of claim 9, further comprising a further transistor gate extending on top of the trench isolation.

12. The integrated circuit of claim 9, wherein the semiconductor layer is made of silicon.

13. The integrated circuit of claim 9, wherein the semiconductor layer has a thickness smaller than 20 nm.

* * * * *